(12) United States Patent
Nishida et al.

(10) Patent No.: US 8,778,774 B2
(45) Date of Patent: Jul. 15, 2014

(54) ENHANCEMENT OF PROPERTIES OF THIN FILM FERROELECTRIC MATERIALS

(75) Inventors: Toshikazu Nishida, Gainesville, FL (US); Antonio Guillermo Acosta, Gainesville, FL (US); John Anthony Rodriguez, Dallas, TX (US); Theodore Sidney Moise, Dallas, TX (US)

(73) Assignees: University of Florida Research Foundation, Inc., Gainesville, FL (US); Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 13/243,077

(22) Filed: Sep. 23, 2011

(65) Prior Publication Data

US 2013/0078742 A1 Mar. 28, 2013

(51) Int. Cl.
*H01L 21/322* (2006.01)
*H01L 27/115* (2006.01)

(52) U.S. Cl.
CPC ............................. *H01L 27/11502* (2013.01)
USPC ........................................... 438/457; 117/94

(58) Field of Classification Search
USPC ........................................... 438/457; 117/94
See application file for complete search history.

(56) References Cited

U.S. PATENT DOCUMENTS

| | | | |
|---|---|---|---|
| 6,020,216 A | 2/2000 | Beratan et al. | |
| 6,156,623 A | 12/2000 | Hendrix et al. | |
| 7,241,656 B2 | 7/2007 | Cross et al. | |
| 7,867,786 B2 | 1/2011 | Ma et al. | |
| 7,935,543 B2 | 5/2011 | Moise et al. | |

OTHER PUBLICATIONS

Ai-Dong Li, Hui-Qing Ling, Di Wu, Tao Yu, Zhi-Guo Liu, Nai-Ben Ming, Characteristics of $SrBi_2Ta_2O_9$ ferroelectric films in an in situ applied low electric field prepared by metalorganic decomposition, Solid State Communications, vol. 125, Issue 9, Mar. 2003, pp. 469-473.*

Hsu, F.-Y., Leu, C.-C., Lu, Y.-L., Ho, S.-T. and Hu, C.-T. (2009), Modifying Structures and Ferroelectric Properties of $Pb(Zr_{0.6}Ti_{0.4})O_3$ Thin Films by Constraint-Annealing of Precrystallized Film. Journal of the American Ceramic Society, 92: 389-395.*

Himcinschi, C., et al., "Uniaxially strained silicon by wafer bonding and layer transfer," Solid-State Electronics, vol. 51, 2007, pp. 226-230.

Jia, Z., et al., "Study on Stress of the Films Applied to FeRAM," Integrated Ferroelectrics, vol. 81, 2006, pp. 97-103.

(Continued)

*Primary Examiner* — Allen Parker
(74) *Attorney, Agent, or Firm* — Saliwanchik, Lloyd & Eisenschenk, P.A.

(57) ABSTRACT

Methods are provided for enhancing properties, including polarization, of thin-film ferroelectric materials in electronic devices. According to one embodiment, a process for enhancing properties of ferroelectric material in a device having completed wafer processing includes applying mechanical stress to the device, independently controlling the temperature of the device to cycle the temperature from room temperature to at or near the Curie temperature of the ferroelectric material and back to room temperature while the device is applied with the mechanical stress, and then removing the mechanical stress. Certain of the subject methods can be performed as part of a back end of line (BEOL) process, and may be performed during the testing phase at wafer or die level.

22 Claims, 5 Drawing Sheets

(56) References Cited

OTHER PUBLICATIONS

Kelman, M., et al., "Effect of applied mechanical strain on the ferroelectric and dielectric properties of Pb(Zr$_{0.35}$Ti$_{0.65}$)O$_3$ thin films," Journal of Applied Physics, vol. 93, No. 11, 2003, pp. 9231-9236.

Kobayashi, S., et al., "Effect of the Interconnect Layer on Pb(Zr,Ti)O$_3$ Thin Film Capacitor Degradation," IEEE Electron Device Letters, vol. 19, No. 11, 1998, pp. 417-419.

Kumazawa, T., et al., "Effect of external stress on polarization in ferroelectric thin films," Applied Physics Letters, vol. 72, No. 5, 1998, pp. 608-610.

Rodriguez, J. A., et al., "Reliability Properties of Low-Voltage Ferroelectric Capacitors and Memory Arrays," IEEE Transaction on Device and Materials Reliability, vol. 4, No. 3, 2004, pp. 436-449.

Shepard, J. F., Jr. et al., "Properties of PZT Thin Films as a Function of In-Plane Biaxial Stress," IEEE, 1996, pp. 161-166.

Spierings, G. A. C. M., et al., "Stresses in Pt/Pb(Zr,Ti)O$_3$ thin-film stacks for integrated ferroelectric capacitors," Journal of Applied Physics, vol. 78, No. 3, 1995, pp. 1926-1933.

Tuttle, B. A. et al., "Chemically prepared Pb(Zr,Ti)O$_3$ Thin Films: The Effects of Orientation and Stress," Applications of Ferroelectronics, 1992, pp. 344-348.

Lee, J.-W. et al, "Effects of Residual Stress on the Electrical Properties of PZT Films," Journal of the American Ceramic Society, 2007, vol. 90, Issue 4, pp. 1077-1080.

Kim, Y., et al., "The electrical properties and retention characteristics of strained PZT thin fim capacitors," Integrated Ferroelectrics, 37:1-4, pp. 285-294, 2001.

Qin, H. X., et al, "PZT thin films with preferred-orientation induced by external stress," Thin Solid Films, 2000, vol. 379, Issues 1-2, pp. 72-75.

Gruverman, A., et al., "Mechanical stress effect on imprint behavior of integrated ferroelectric capacitors," Applied Physics Letters, 2003, vol. 83, No. 4, pp. 728-730.

Liu, Y., et al., "Stress impact on dielectric properties of Bi$_{3.15}$Nd$_{0.85}$Ti$_3$O$_{12}$ films" Applied Physics Letter, 2010, vol. 96, 072902.

Zhu, H., et al., "Polarization change in ferroelectric thin film capacitors under external stress," Journal of Applied Physics, 2009, vol. 105, 061609.

Xu, F., et al., "Domain wall motion and its contribution to the dielectric and piezoelectric properties of lead zirconate titanate films," Journal of Applied Physics, 2001, vol. 89, No. 2, pp. 1336-1348.

Leist, T., et al., "Domain switching energies: Mechanical versus electrical loading in La-doped bismuth ferrite—lead titanate," Journal of Applied Physics, 2011, vol. 109, 054109.

Webber, K. G., et al., "Temperature-dependent ferroelastic switching of soft lead zirconate titanate," Acta Materialia, vol. 57, Issue 15, Sep. 2009, pp. 4614-4623.

Wang, X. S., et al., "The effects of uniaxial stress distribution on the ferroelectric properties of thin films with first-order phase transition," Solid State Communications, vol. 121, Issues 2-3, Jan. 2, 2002, pp. 111-115.

Lian, L., et al., "Stress effects in sol-gel derived ferroelectric thin films," Journal of Applied Physics, 2004, vol. 95, No. 2.

Zhang, J. X., et al., "Tuning the remanent polarization of epitaxial ferroelectric thin films with strain," Applied Physics Letters, 2009, vol. 95, Issue 12.

Janolin, P.-E., "Strain on ferroelectric thin films," Journal of Materials Science, 2009, vol. 44, Issue 19, pp. 5025-5048.

Wang, J., "Strain tenability of dielectric and ferroelectric properties in epitaxial lead titanate thin films," Theoretical & Applied Mechanics Letters, 2011, 011003.

\* cited by examiner

ENHANCEMENT OF PROPERTIES OF THIN FILM FERROELECTRIC MATERIALS

BACKGROUND

As semiconductor devices continue to be scaled to ever smaller dimensions, the properties of the device materials begin to provide constraints and new challenges in achieving the projected benefits of scaling. The introduction of ferroelectric films and devices has not slowed the scaling trend. For example, over the past decade, ferroelectric random access memory (FRAM) has emerged as a viable non-volatile memory for applications requiring low power, fast read/write access time, and high cycling endurance.

However, scaling requires decreased ferroelectric thin-film thickness, which may result in reduced polarization of the ferroelectric film. In FRAM applications, reduced polarization can result in reduced FRAM signal margin, which is a key metric for reliable operation of the FRAM, because the FRAM signal margin is directly related to the amount of switched polarization (Psw) in the capacitor formed using the ferroelectric film.

BRIEF SUMMARY

Properties of thin film ferroelectric materials can be enhanced by particular application of stress/strain, temperature, and/or bias in accordance with certain embodiments of the present invention. The enhancement of the thin films by application of one or more of the subject methods can enable scaling of devices while maintaining or improving performance of devices that employ thin film ferroelectric films including, but not limited to, ferroelectric random access memories (FRAM), ferroelectric field-effect transistors (FeFET), ferroelectric memory field-effect transistors (FEMFET), ferroelectric microelectromechanical systems (MEMS) sensors and actuators, and ferroelectric MEMS and non-MEMS energy harvesters.

According to one embodiment of the invention, a method is provided that increases the polarization of ferroelectric thin films employed in integrated ferroelectric devices on a device wafer having completed wafer-level processing, including metal layers, pads, and passivation (referred to herein as being "processing-completed"). In certain embodiments, the method includes application of a specific external mechanical stress at a specific temperature for a specific duration on a processing-completed device wafer. The application of stress can be independently controlled from the cycling of the temperature by applying the stress through external means, enabling the stress to be applied and maintained through one or more temperature cycles during which the device is exposed to high temperatures and cooled down to a lower temperature.

According to a further embodiment of the invention, a specific electric bias is applied in addition to the applied external mechanical stress and exposure temperature.

Although this Summary presents selected concepts and features described in more detail in the Detailed Description, it should be understood that the Summary is not intended to identify key features or essential features of the claimed subject matter or to limit the scope of the claims.

DETAILED DISCLOSURE

Methods are disclosed that can be used to enhance certain properties of ferroelectric materials integrated on processing-completed device wafers.

In accordance with certain embodiments of the invention, external mechanical stress, temperature, and, in some cases, applied bias or electric fields are used to enhance properties of ferroelectric thin films including but not limited to PZT (lead zirconate titanate). These enhanced properties enable small sized ferroelectric devices through the next technology nodes—where current trends have the thickness of the ferroelectric material decreasing, which tends to cause the material to depolarize. Accordingly, certain embodiments of the invention are applicable to current ferroelectric materials and structures as well as future materials and devices created for the next technology nodes.

It should be understood that while the term ferroelectric is being used herein, this does not necessarily refer to material that includes iron. Rather, the ferroelectric material is a material that can switch polarity in an electric field, but is not affected by magnetic fields.

By enhancing properties, such as the polarization, of ferroelectric materials of ferroelectric devices, performance of these ferroelectric devices can be improved.

The signal margin in FRAM corresponds to the voltage difference between the Data "0" and Data "1" logic states. By increasing the polarization margin—the switchable polarization Psw—for a ferroelectric material, the signal margin for the FRAM devices increases.

The process for enhancing the ferroelectric materials in a device can be performed as part of a back end of line (BEOL) process, and may be performed during the testing phase at wafer or die level.

Figure 1:
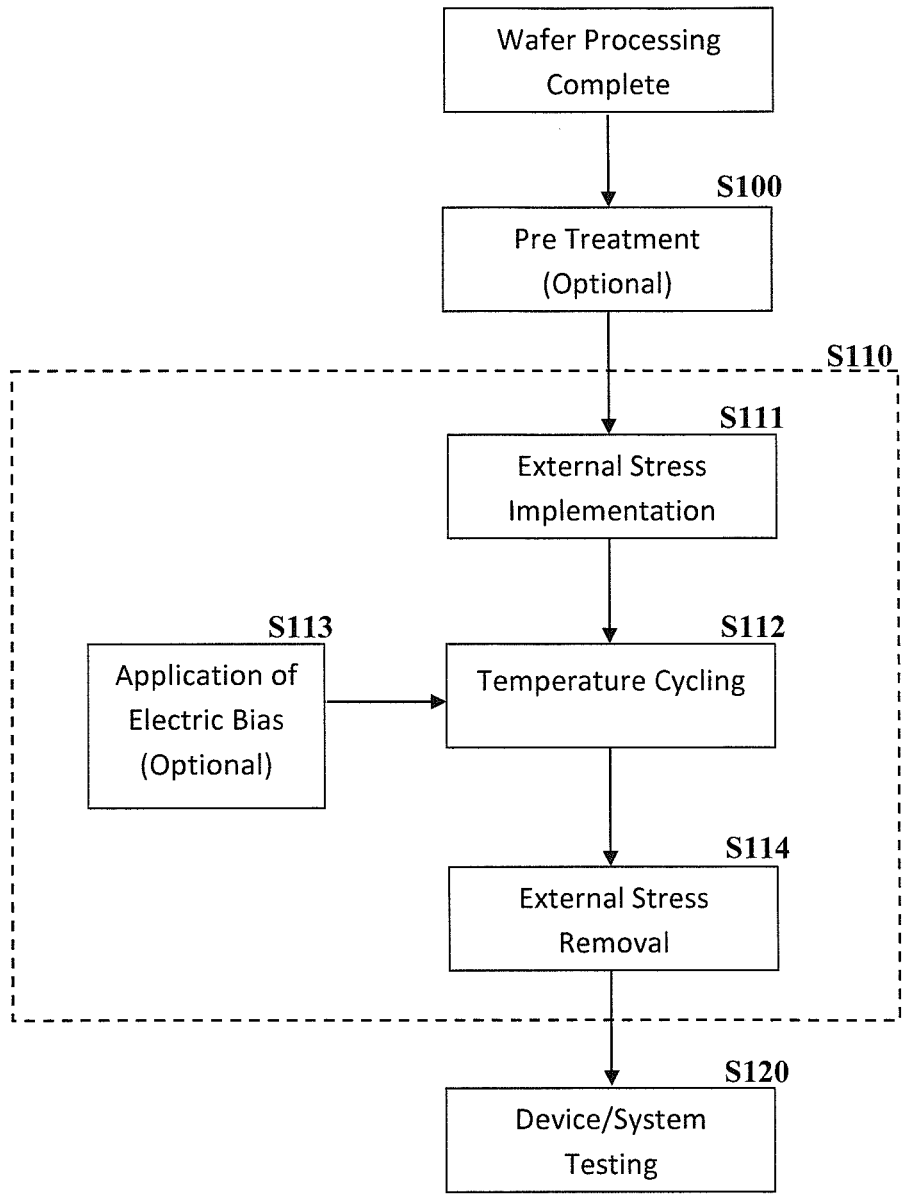
FIG. 1 shows a process flow diagram for describing a ferroelectric material property enhancement method in accordance with certain embodiments of the invention that begins with a processing-completed device wafer.

FIG. 1 shows a process flow diagram for describing a ferroelectric material property enhancement method in accordance with certain embodiments of the invention on a processing-completed device wafer. According to one embodiment, a ferroelectric thin film-based device can undergo a material property enhancement treatment as part of a back-end of line process performed at a wafer level, die-level, or even packaged chip level.

Referring to FIG. 1, an enhancement method S110 according to one embodiment includes applying mechanical stress S111 to a ferroelectric thin film-based processing-completed device. This can be accomplished by releasably securing the device to a mechanical apparatus for the application of uniaxial or multiaxial (e.g., biaxial) stress.

FIGS. 2-5 illustrate examples of mechanical apparatus configurations that can be used to apply stress to a substrate. These configurations may also be referred to as mechanical bending apparatus. In one embodiment, a screw (not shown) can be used for bringing two opposing plates together or can be used to releasably secure a substrate between two opposing plates having particular protrusions for applying bend to the substrate.

Figure 2A:
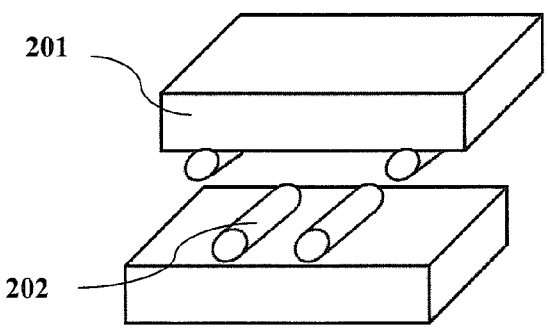
FIGS. 2A and 2B show a perspective and cross-sectional view, respectively, of a mechanical apparatus for applying uniaxial stress with four-point bending in accordance with an embodiment of the invention.
Figure 2B:
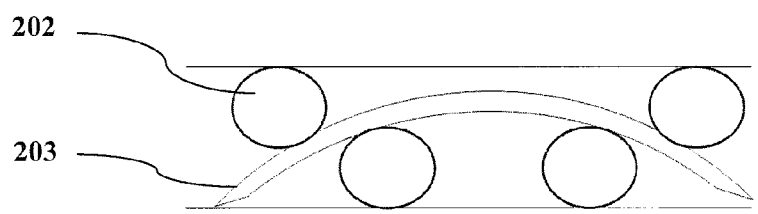

FIGS. 2A and 2B show a perspective and cross-sectional view, respectively, of a mechanical apparatus for applying uniaxial stress with four-point bending in accordance with an embodiment of the invention. The four-point bending of the apparatus can apply both compressive and tensile uniaxial stress. A substrate having the ferroelectric thin film-based device can be positioned between two plates 201 having roller shaped protrusions 202 for contacting four regions of the substrate 203. Each plate 201 has two protrusions 202 to provide the four-point contact where the two protrusions of one plate are closer together than the two protrusions of the other plate and may fit within the space between the two protrusions of the other plate. As shown in FIG. 2B, two of the protrusions 202 can contact a bottom surface of the substrate 203 and two of the protrusions 202 contact a top surface of the substrate 203.

Figure 3A:
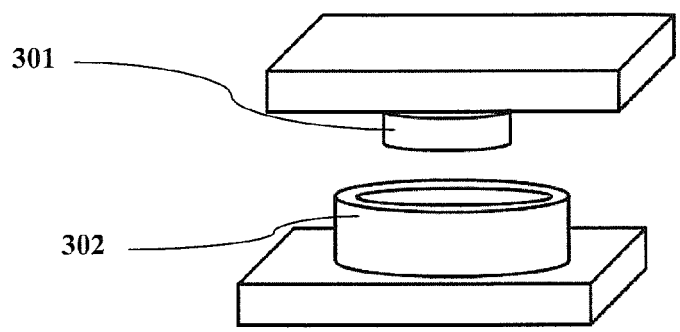
FIGS. 3A and 3B show a perspective and cross-sectional view, respectively, of a mechanical apparatus for applying biaxial stress with two-point (via concentric rings) bending in accordance with an embodiment of the invention.
Figure 3B:
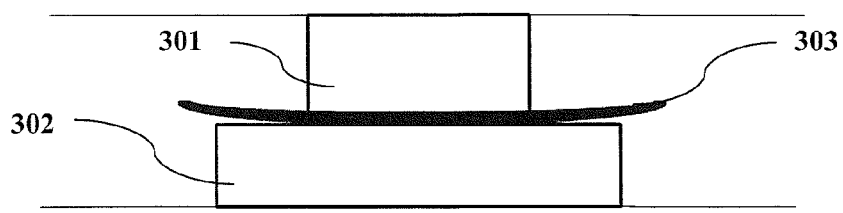

FIGS. 3A and 3B show a perspective and cross-sectional view, respectively, of a mechanical apparatus for applying biaxial stress with two-point bending in accordance with another embodiment of the invention. A substrate having the ferroelectric thin film-based device can be positioned between two concentric rings 301, 302 where one ring has a smaller diameter than the other ring. The concentric rings can be used to apply compressive and tensile biaxial stress. As shown in FIG. 3B, stress is applied to the substrate by securing the substrate 303 between the two rings 301, 302 as the smaller ring is fitted into the larger ring.

Figure 4A:
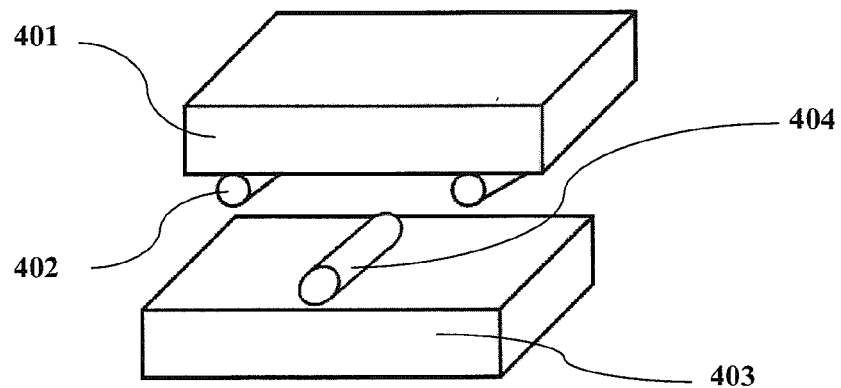
FIGS. 4A and 4B show a perspective and cross-sectional view, respectively, of a mechanical apparatus for applying uniaxial stress with three-point bending in accordance with an embodiment of the invention.
Figure 4B:
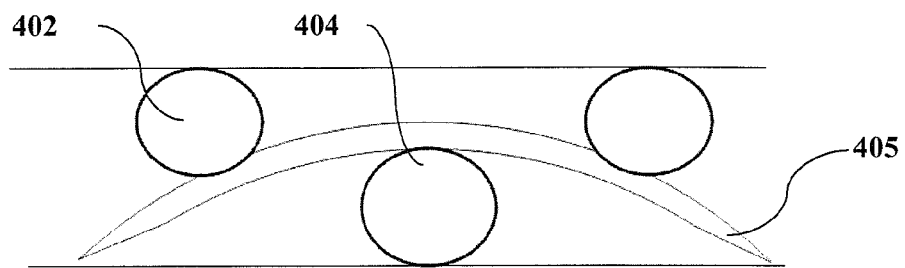

FIGS. 4A and 4B show a perspective and cross-sectional view, respectively, of a mechanical apparatus for applying uniaxial stress with three-point bending in accordance with yet another embodiment of the invention. Compressive and tensile stress can be applied via the three-point bending apparatus. A substrate having the ferroelectric thin film-based device can be positioned between two plates having protrusions for contacting three regions of the substrate. One plate 401 can have two roller shaped protrusions 402 and the other plate 403 can have a single protrusion 404. The single protrusion 404 can be centrally located or positioned closer to one side or another. The single protrusion 404 can be hemispherical, spherical, pyramidal, or rectangular/box-like in shape. As shown in FIG. 4B, the two roller shaped protrusions 402 contact one surface of the substrate 405 and the single protrusion 404 contacts the other surface of the substrate 405.

Figure 5:
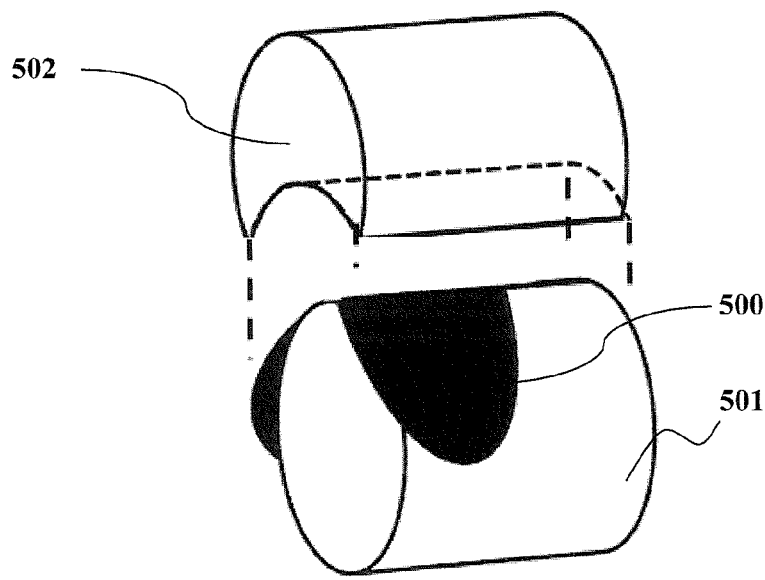
FIG. 5 shows a perspective view of a mechanical apparatus for applying stress in accordance with another embodiment of the invention.

FIG. 5 shows a perspective view of a mechanical apparatus for applying stress in accordance with another embodiment of the invention. As shown in FIG. 5, the mechanical apparatus bends a wafer 500 by using a cylinder 501 on which the wafer is bent. In order to bend the wafer 500 onto the cylinder 501, a load 502 is used to apply a force onto the wafer 500 such that the radius of curvature of the wafer matches the curvature of the cylinder.

In a further embodiment, stress amplification of the ferroelectric thin film can be accomplished by forming a composite substrate before securing the substrate/device onto a mechanical apparatus for applying stress to the substrate. In one such embodiment, the substrate having the ferroelectric thin film device is thinned, creating a thinned device layer. This may be part of the original wafer processing or performed to facilitate the stress amplification. The thinned device layer is then attached to another substrate (which may be referred to as a handle layer, handle wafer, or handle substrate). The attachment process can be any suitable attachment process and may be wafer to wafer level or even smaller portions such as die level to a handle substrate of a similar or larger size (area). For example, the attachment process can be a wafer bonding process via anodic bonding, intermediate layer bonding, or direct bonding. In addition, the bonding process may be carried out at the wafer level and then diced before securing the composite substrate to a mechanical bending apparatus.

Figure 6:
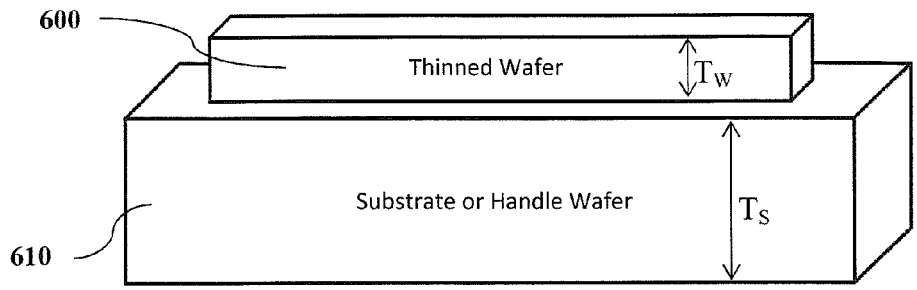
FIG. 6 illustrates a configuration for stress amplification in accordance with an embodiment of the invention.

As shown in FIG. 6, the thickness ($T_W$) of the device layer 600 is smaller than the thickness ($T_S$) of the handle layer 610 on which the device layer 600 is bonded. In addition, or as an alternative, the handle layer 610 can be selected to possess an elastic modulus smaller than the elastic modulus of the device layer 600 such that mechanical bending of the composite device/handle substrate results in stress amplification of the ferroelectric thin film. In accordance with an embodiment of the invention, the composite device/handle substrate can be secured to any of the mechanical bending apparatus described above. While certain embodiments contemplate using only a difference in thicknesses or only a difference in elastic moduli, by providing a difference in thicknesses coupled with a difference in elastic moduli, considerable strain amplification can be facilitated while the substrate is applied with strain from a mechanical bending apparatus.

For certain embodiments performing an enhancement method at a wafer level, the mechanical stress apparatus can include multiple regions of two-point, three-point and/or four point contacts for providing uniaxial or multiaxial stress to each corresponding region on the wafer.

Returning again to FIG. 1, once the substrate is secured in the mechanical stress apparatus and a particular stress is being applied, the substrate is ready to undergo temperature cycling S112. The temperature cycling step S112 involves heating and cooling of the substrate at least once while the substrate is applied with the mechanical stress. When using a mechanical stress apparatus to apply the mechanical stress, the mechanical stress apparatus can be formed of material that is stable at the high temperatures used in the heating of the substrate. For example, quartz may be used as the material for the mechanical stress apparatus.

During the temperature cycling S112, the heating can be carried out by using, for example, a resistive furnace or other external and local heating devices and methods. The cooling can be accomplished by simply removing the substrate from an applied heat source and allowing the substrate to cool to a lower temperature, such as room temperature. For example, the furnace or oven can be turned off or have the heating element provide a lower temperature. As another example, a reflow oven can be used to expose the substrate to a particular temperature. In the reflow oven, a sample substrate can be carried through different heating zones by a belt. The belt can move the substrate into different heating zones with particular temperature profiles, including a profile that begins at room temperature and increases steadily towards the desired high temperature before dropping to a lower temperature.

The cycling can be performed as a single heating and cooling session or can be performed multiple times, where the substrate is heated and cooled repeatedly.

In accordance with certain embodiments of the invention, the substrate is heated at or near the ferroelectric material's Curie temperature ($T_{Curie}$) for a predetermined amount of time while having external mechanical stress applied. The Curie temperature is the temperature at which a ferroelectric material becomes paraelectric (e.g., loses its spontaneous polarization in the absence of an externally applied electric field).

In other embodiments, the substrate is heated to a temperature less than the material's Curie temperature, but still elevated to affect polarization of the ferroelectric material. For example, the substrate can be heated to a temperature of greater than 300° C., and in certain embodiments at least 370° C., for a predetermined amount of time while having external mechanical stress applied.

After performing the temperature cycling S112, the stress is removed S114. The stress can be removed by, for example, releasing the substrate from the mechanical stress apparatus.

In a further embodiment, an electric bias is applied S113 to the ferroelectric material at one or more stages during the temperature cycling step S112. That is, an electric bias or electric field can be applied before, during, and/or after the substrate is heated to an elevated temperature. In one embodiment, the electric bias or electric field is applied while the ferroelectric material is at (or near) its Curie temperature. The electric bias or electric field may be continued to be applied as the ferroelectric material is cooled down. For one such embodiment, the same electric bias or electric field is maintained during the cooling down period. In another embodiment, the electric bias or electric field is modified according to a predetermined configuration as the material is cooled down.

After performing the enhancement method S110 in accordance with certain embodiments of the invention, additional processes such as device and/or system testing S120, and packaging/assembly can be performed. In certain embodiments, some device or systems tests are performed before performing the subject enhancement method. In addition, in certain embodiments, the subject enhancement method is performed after performing one or more packaging steps.

In a specific embodiment example for a FRAM device, the pre-treatment S100 can be a powering-on of the device or a wake-up cycling that data cycles or resets the memory cells. The wake-up cycling can be used to apply a particular bias or voltage to the ferroelectric thin film of the device. This particular bias can be used to contribute to enhancing the material properties of the device.

In accordance with certain embodiments of the invention, an increase in the ferroelectric thin film polarization is achieved while maintaining the coercive field. Various embodiments of the invention apply particular combinations of external mechanical stress, temperature, and electric field to enhance ferroelectric thin film properties to enhance performance in devices and systems that employ ferroelectric thin films on processing-completed wafers. These devices and systems include, but are not limited to, FRAM, FEMFETs, ferroelectric MEMS sensors and actuators, ferroelectric MEMS and non-MEMS energy harvesters, and other devices that employ thin film ferroelectric materials.

As the ferroelectric thin films become thinner, embodiments of the subject methods can further enhance the material properties due to the physics attributable to single domain or near single domain ferroelectric thin film devices.

A greater understanding of the present invention and of its many advantages may be had from the following example(s), given by way of illustration. The following example(s) are illustrative of some of the methods, applications, embodiments and variants of the present invention. They are, of course, not to be considered in any way limitative of the invention. Numerous changes and modifications can be made with respect to the invention.

EXAMPLE

Figure 7:
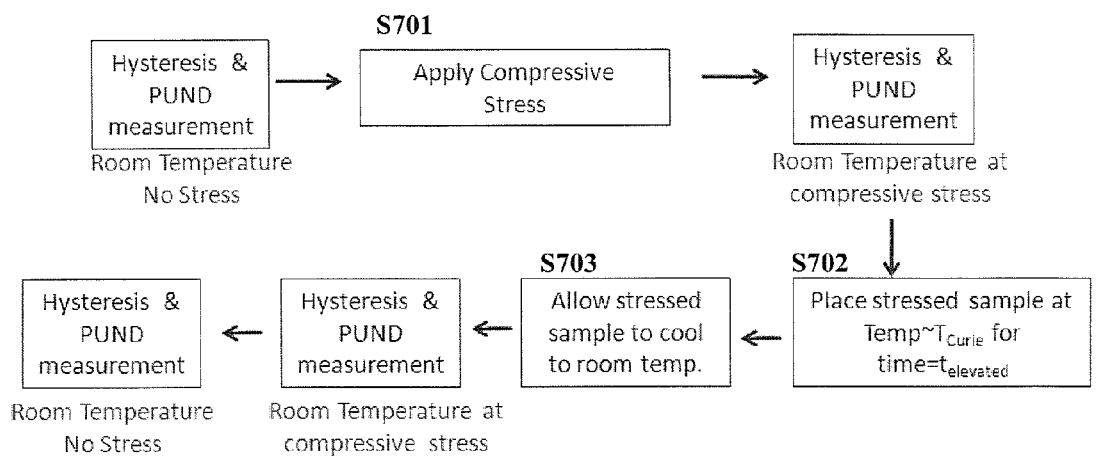
FIG. 7 shows a process flow diagram of a method of performing stress-temperature ferroelectric polarization enhancement in accordance with one embodiment of the invention.

Experiments were conducted to illustrate the effects of the application of stress at elevated temperature (with and without an additional electric bias) on processing-completed FRAM devices having PZT ferroelectric thin films. FIG. 7 shows a flow chart of the ferroelectric polarization enhancement method of an embodiment of the invention applied to the FRAM devices. References to test points where hysteresis and switching/non-switching polarization (PUND) measurements were performed to collect data are included in the flow chart.

For the example experiment, the hysteresis was measured using a Sawyer-Tower Circuit and the switching/non-switching polarization was measured by employing the P-U-N-D method as described by Rodriguez et al. in "Reliability Properties of Low-Voltage Ferroelectric Capacitors and Memory Arrays," (*IEEE Trans. on Device and Materials Reliability*, Vol. 4, No. 3, September 2004), which is incorporated herein by reference in its entirety.

As shown in FIG. 7, the basic steps performed for the ferroelectric polarization enhancement method of the example embodiment include applying compressive stress 5701, placing the stressed sample at a temperature of at or near $T_{Curie}$ for a time of $t_{elevated}$ S702, and allowing the sample to cool to room temperature S703. In the example embodiment, the samples were heated to between 370° C. and 430° C.

Figure 8:
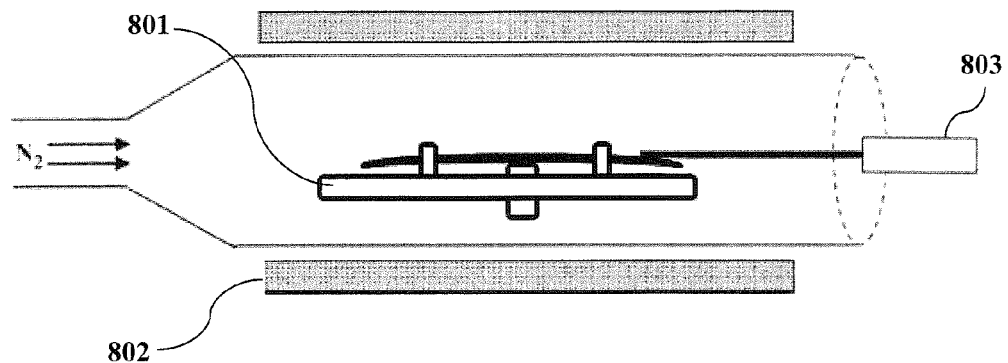
FIG. 8 shows a schematic of a stress-temperature ferroelectric polarization enhancement system in accordance with one embodiment of the invention.

FIG. 8 illustrates the test system used to perform the ferroelectric polarization enhancement method of certain embodiments of the invention. Referring to FIG. 8, compressive stress can be applied to a sample substrate having integrated FRAM device(s) using a quartz mechanical bending apparatus 801. The quartz material of the mechanical bending apparatus 801 enables the apparatus to withstand high temperatures, but may be made of any suitable material. The stressed sample (being secured to the mechanical bending apparatus) can be placed in a chamber of a tube furnace that is heated using a heating coil 802. In the chamber, the sample can be exposed to a nitrogen or other inert gas. The temperature of the sample can be monitored using, for example, a thermocouple element 803.

In certain example embodiments, a Hysteresis and PUND measurement was performed at room temperature while the sample was under compressive stress. The P-U-N-D method applies bias to the FRAM device for read and write operations (including performing wake up cycling), providing an electric bias to the device. The additional bias may be applied to the device during this time as part of the enhancement method.

According to the examples, a significant increase in the polarization of the PZT ferroelectric thin films was measured for several samples where the sample was heated under compressive uniaxial stress at or near the Curie temperature of the thin film using a procedure as described in FIG. 7. Specifically, a 70 nm thick PZT film was used in the FRAM samples having capacitor areas of 3600 µm². 150 MPa of compressive stress was applied using the quartz mechanical bending apparatus and the samples were heated to 370° C. for two minutes before allowing the samples to cool to room temperature. For the PUND measurements, the wakeup cycling involved application of a 1.5 V, 1 kHz triangle pulse.

Figure 9:
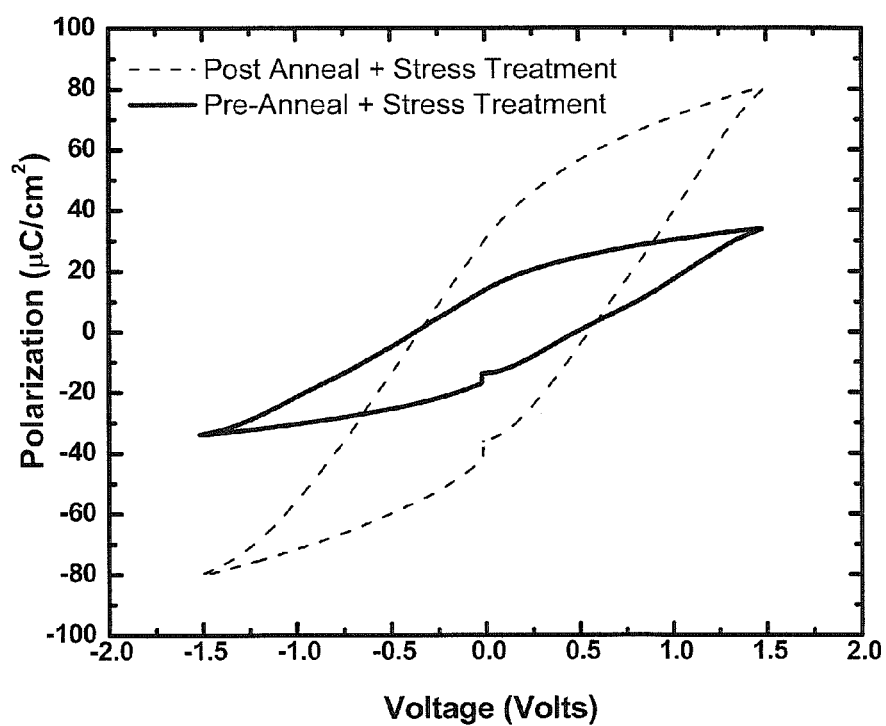
FIG. 9 shows a plot of hysteresis of a thin film PZT ferroelectric capacitor captured before and after the stress-temperature ferroelectric polarization enhancement method as described with respect to FIG. 7.

FIG. 9 shows a representative graph of the hysteresis curves before and after the stress/temperature treatment, which shows a near 300% increase in the remanent polarization. As indicated by the flow chart of FIG. 7, initial hysteresis measurements were taken at room temperature with no applied stress both before (pre-anneal, pre-stress, pre-wakeup) and after (pre-anneal, pre-stress, post-wakeup) the wake-up cycling that is performed as part of the PUND measurements. These measurements are illustrated in the hysteresis curve for the pre-anneal+stress treatment in FIG. 9. Then after applying compressive stress (S501), performing the heating/annealing (S502), and allowing the samples to cool (S503), measurements were taken at room temperature while the samples were under stress. A final hysteresis curve was obtained after removing the stress, demonstrating the improved polarization of the thin film ferroelectric material, as shown by the hysteresis curve in FIG. 9 for the post-anneal+stress treatment. Advantageously, the coercive field is maintained using this polarization enhancement method, which helps to maintain the low voltage operation of ferroelectric devices.

The polarization enhancement has been demonstrated experimentally up to 300% (3×). This enhanced polarization can improve the performance of devices fabricated according to existing technology nodes and enable future scaled technologies without requiring new materials or device structures.

Although repeated reference is made to applying stress to a substrate having a ferroelectric thin film device thereon, it should be understood that it is a combination of stress and strain.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. A method of enhancing the properties of a ferroelectric device, the method comprising:
   applying an external mechanical stress to a substrate comprising a ferroelectric device, metal layers, pads, and passivation;
   performing a temperature cycling for heating and cooling the substrate having the external mechanical stress, wherein while the external mechanical stress is applied, the temperature cycling is performed at temperatures selected so as to enhance ferroelectric properties of the ferroelectric device; and
   removing the external mechanical stress.

2. The method according to claim 1, wherein applying the external mechanical stress comprises using a mechanical bending apparatus.

3. The method according to claim 2, wherein the mechanical bending apparatus comprises a four-point bending apparatus.

4. The method according to claim 2, wherein the mechanical bending apparatus comprises a three-point bending apparatus.

5. The method according to claim 2, wherein the mechanical bending apparatus comprises a two-point bending apparatus.

6. The method according to claim 2, wherein the mechanical bending apparatus comprises a cylinder upon which the substrate is bent to match a curvature of the cylinder upon application of a load.

7. The method according to claim 2, further comprising attaching the substrate comprising the ferroelectric device to a handle substrate to form a compound substrate before applying the external mechanical stress, wherein the handle substrate possesses an elastic modulus smaller than that of the substrate comprising the ferroelectric device.

8. The method according to claim 7, further comprising thinning the substrate comprising the ferroelectric device such that the handle substrate is thicker than the substrate comprising the ferroelectric device before attaching the substrate comprising the ferroelectric device to the handle substrate.

9. The method according to claim 1, wherein performing the temperature cycling for heating and cooling the substrate having the applied mechanical stress comprises:
   heating the substrate to a first temperature; and
   allowing the substrate to cool to a second temperature.

10. The method according to claim 9, wherein the first temperature is at or near the Curie temperature of a ferroelectric film of the ferroelectric device.

11. The method according to claim 9, wherein the first temperature is greater than 300° C.

12. The method according to claim 9, wherein the second temperature is room temperature.

13. The method according to claim 9, wherein performing the temperature cycling for heating and cooling the substrate having the applied mechanical stress further comprises heating the substrate to a third temperature and allowing the substrate to cool to a fourth temperature.

14. The method according to claim 13, wherein the third temperature is substantially the same as the first temperature and the fourth temperature is substantially the same as the second temperature.

15. The method according to claim 9, wherein the heating of the substrate to the first temperature is performed in a furnace while the substrate is exposed to a nitrogen ambient.

16. The method according to claim 1, further comprising:
   applying an electric bias or electric field to the ferroelectric device while the substrate is applied with the mechanical stress.

17. The method according to claim 16, wherein the applying of the electric bias or the electric field is performed while the substrate is heated and applied with the mechanical stress.

18. The method according to claim 17, wherein the external mechanical stress is applied, the temperature cycling is performed, and the electric bias or the electric field is applied at parameters selected to enhance the ferroelectric properties including increasing the polarization of the ferroelectric device.

19. The method according to claim 1, wherein the substrate is a semiconductor wafer.

20. The method according to claim 1, wherein the substrate is a die.

21. The method according to claim 1, wherein the substrate comprises a plurality of ferroelectric devices upon which the external mechanical stress is applied and temperature cycling is performed.

22. The method according to claim 1, wherein the external mechanical stress is applied and the temperature cycling is performed at parameters selected to increase polarization of a ferroelectric film forming the ferroelectric device.

* * * * *

UNITED STATES PATENT AND TRADEMARK OFFICE
CERTIFICATE OF CORRECTION

| | |
|---|---|
| PATENT NO. | : 8,778,774 B2 |
| APPLICATION NO. | : 13/243077 |
| DATED | : July 15, 2014 |
| INVENTOR(S) | : Toshikazu Nishida et al. |

It is certified that error appears in the above-identified patent and that said Letters Patent is hereby corrected as shown below:

In the Specification

Column 6,
Line 35, "5701" should read --S701--.

Signed and Sealed this
Sixth Day of January, 2015

Michelle K. Lee
*Deputy Director of the United States Patent and Trademark Office*